United States Patent
Mao et al.

(10) Patent No.: US 7,978,107 B1
(45) Date of Patent: Jul. 12, 2011

(54) DIGITAL-TO-ANALOG CONVERTER TO PRODUCE PAIRED CONTROL SIGNALS IN A POWER SUPPLY CONTROLLER

(75) Inventors: Mingming Mao, Cupertino, CA (US); Yury Gaknoki, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 13 days.

(21) Appl. No.: 12/642,450

(22) Filed: Dec. 18, 2009

(51) Int. Cl.
*H03M 1/66* (2006.01)

(52) U.S. Cl. ........ 341/142; 341/152; 323/283; 327/172; 332/109

(58) Field of Classification Search .................. 341/142, 341/152; 323/283; 332/109, 110; 327/172–176
See application file for complete search history.

(56) References Cited

U.S. PATENT DOCUMENTS

| | | | | |
|---|---|---|---|---|
| 4,638,417 A * | 1/1987 | Martin et al. | ................... | 363/41 |
| 5,198,785 A * | 3/1993 | Jordan | ........................... | 332/109 |
| 5,208,559 A * | 5/1993 | Jordan | ........................... | 332/109 |
| 5,563,605 A * | 10/1996 | McEwan | ....................... | 342/202 |
| 6,501,402 B2 | 12/2002 | Boxho | | |
| 7,548,047 B1 * | 6/2009 | Dasgupta et al. | .............. | 323/283 |
| 2002/0021236 A1 * | 2/2002 | Greig | ............................ | 341/136 |

* cited by examiner

*Primary Examiner* — Howard Williams
(74) *Attorney, Agent, or Firm* — Blakely Sokoloff Taylor & Zafman LLP

(57) ABSTRACT

An example digital-to-analog converter (DAC) for a power supply controller includes a first node, a second node, a current source, and a switch. The first node is to be coupled to provide a first analog signal to a variable oscillator of the power supply controller. The second node is to be coupled to provide a second analog signal to the variable oscillator of the power supply controller. The switch is coupled to the current source and configured to couple the current source to the first node to provide current to the first analog signal in response to a binary digit received by the DAC, where the switch is further configured to couple the current source to the second node to provide current to the second analog signal in response to a complement of the binary digit.

15 Claims, 4 Drawing Sheets

DIGITAL-TO-ANALOG CONVERTER TO PRODUCE PAIRED CONTROL SIGNALS IN A POWER SUPPLY CONTROLLER

BACKGROUND INFORMATION

1. Field of the Disclosure

This invention is related to controllers for power supplies. In particular, the invention is related to controllers that control two parameters of a switching signal that controls a switch in a switching power supply.

2. Background

In a typical application, an ac-dc power supply receives an input that is between 100 and 240 volts rms (root mean square) from an ordinary ac electrical outlet. Switches in the power supply are switched on and off by a control circuit to provide a regulated output that may be suitable for providing current to light emitting diodes (LEDs) for illumination. The output is typically a regulated dc current, and the voltage at the LEDs is typically less than 40 volts.

An ac-dc power supply that provides regulated current to LEDs typically must meet requirements for power factor and efficiency as explained below. Designers are challenged to provide satisfactory solutions at the lowest cost.

The electrical outlet provides an ac voltage that has a waveform conforming to standards of magnitude, frequency, and harmonic content. The ac current drawn from the outlet, however, is determined by the characteristics of the power supply that receives the ac voltage. In many applications, regulatory agencies set standards for particular characteristics of the current that may be drawn from the ac electrical outlet. For example, a standard may set limits on the magnitudes of specific frequency components of the ac current. In another example, a standard may limit the rms value of the current in accordance with the amount of power that the outlet provides. Power in this context is the rate at which energy is consumed, typically measured in the units of watts.

The general goal of all such standards for the ac current is to reduce the burden on the system that distributes ac power, sometimes called the power grid. Components of the current at frequencies other than the fundamental frequency of the ac voltage, sometimes called harmonic components, do no useful work, but yet the power grid must have the capacity to provide them and it must endure losses associated with them. Harmonic components generally distort the ideal current waveform so that it has a much higher maximum value than is necessary to deliver the required power. If the power grid does not have the capacity to provide the harmonic components, the waveform of the voltage will drop to an unacceptable value at times that are coincident with the peaks of the distorted waveform of the current. The most desirable ac current has a single frequency component that is at the fundamental frequency of the ac voltage. Moreover, the waveform of the most desirable ac current will be in phase with the ac voltage. That is, the peak ac current will occur at the same time as the peak of the ac voltage. The ideal current will have an rms value that is equal to the value of the power from the outlet divided by the rms value of the voltage. In other words, the product of the rms voltage and the rms current will be equal to the power from the outlet when the current has ideal characteristics.

Power factor is a measure of how closely the ac current approaches the ideal. The power factor is simply the power from the outlet divided by the product of the rms current multiplied by the rms voltage. A power factor of 100% is ideal. Currents that have frequency components other than the fundamental frequency of the ac voltage will yield a power factor less than 100% because such components increase the rms value but they do not contribute to the output power. Currents that have only the fundamental frequency of the ac voltage but are not in phase with the ac voltage will also yield a power factor less than 100% because the power from the outlet is reduced when the peak ac current does not occur at the same time as the peak ac voltage, while the rms value of the current remains at its ideal minimum value. That is, an ideal ac current that is not in phase with the ac voltage will yield a power factor less than 100%. The fundamental frequency of the ac voltage is typically either 50 Hz or 60 Hz in different regions of the world. By way of example, the fundamental frequency of the ac voltage is nominally 60 Hz in North America and Taiwan, but it is 50 Hz in Europe and China.

Since the power supply that receives the ac voltage determines the characteristics of the ac current, power supplies often use either special active circuits or special control techniques to maintain a high power factor. Power supplies that use only ordinary passive rectifier circuits at their inputs typically have low power factors that in some examples are less than 50%, whereas a power factor substantially greater than 90% is typically required to meet the standards for input current, such as for example the International Electrotechnical Commission (IEC) standard IED 61000-3-2. Although regulatory agencies in some regions may impose the standards, manufacturers of consumer equipment often voluntarily design their products to meet or to exceed standards for power factor to achieve a competitive advantage. Therefore, ac-dc power supplies for LEDs, for example, typically must include power factor correction.

The efficiency of a power supply is a measure of how much of the power received by the power supply is delivered to the output of the power supply. A power supply that is 100% efficient delivers to the output all the power it receives at the input. A power supply that is for example 80% efficient delivers only 80% of the power it receives to the output, losing 20% of the power it receives. Regulatory agencies usually mandate minimum efficiencies for power supplies under various operating conditions. The efficiency of a power supply usually has a strong relationship to the switching frequency. Therefore, power supplies typically must control the switching frequency to maintain high efficiency.

To provide a regulated output current at high efficiency from a power factor corrected ac input, a power supply typically varies both the on-time and the frequency of a switching signal that switches a switch. As such, there is a need for an integrated circuit controller that can vary two control parameters in a precise and coordinated manner at low cost.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Methods and apparatuses for implementing a digital-to-analog converter to produce paired control signals in a power supply controller are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
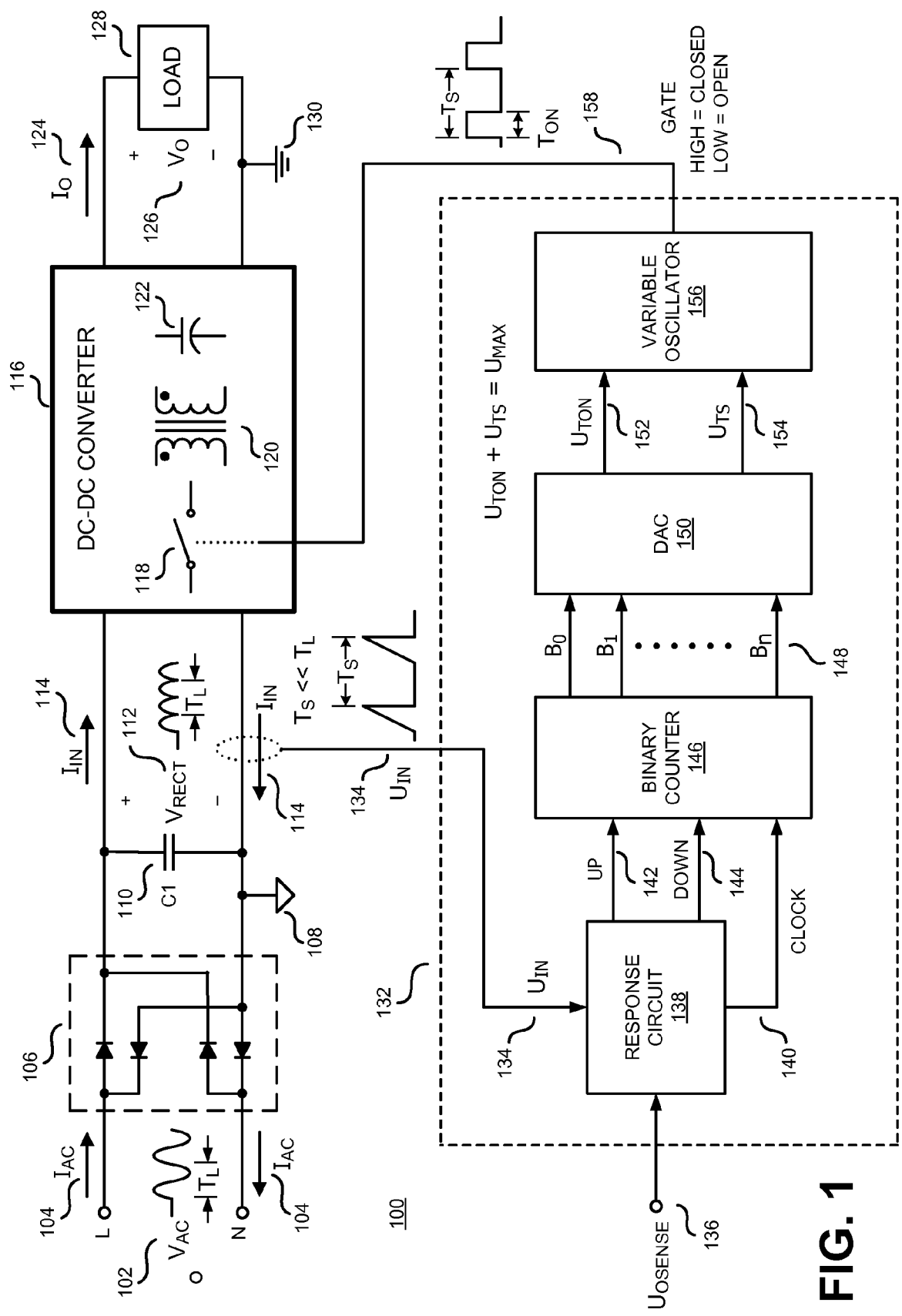
FIG. 1 is a block diagram of one example of an ac-dc power supply that maintains a high power factor while regulating an output current at high efficiency, in accordance with the teachings of the present disclosure.

The schematic diagram of FIG. 1 shows the salient features of one example of an ac-dc power supply 100 receiving an ac input voltage $V_{AC}$ 102 that has a substantially sinusoidal waveform with a period $T_L$ that is the ac line period. The example power supply 100 of FIG. 1 has an ac input current $I_{AC}$ 104.

In the example power supply of FIG. 1, a full wave bridge rectifier 106 produces a dc rectified voltage $V_{RECT}$ 112 that is received by a dc-dc converter 116. Rectified voltage $V_{RECT}$ 112 is positive with respect to an input return 108. Dc-dc converter 106 has an input current $I_{IN}$ 114 that has a pulsating waveform with a period $T_S$ that is the switching period. In the example of FIG. 1, the waveform of the pulsating input current $I_{IN}$ 114 has a triangular shape. The switching period $T_S$ is much less than the ac line period $T_L$. The switching period $T_S$ is the reciprocal of the switching frequency, and the ac line period $T_L$ is the reciprocal of the ac line frequency. In one example, the switching period $T_S$ is about 15 microseconds whereas the ac line period $T_L$ is about 20 milliseconds. In other words, the ac line period $T_L$ is typically 1000 times greater than the switching period $T_S$, so that there are typically 1000 switching periods within one ac line period.

In the example power supply of FIG. 1, a small capacitor C1 110 across the dc terminals of bridge rectifier 106 provides a low impedance source for the pulses of input current $I_{IN}$ 114. Capacitor C1 110 filters the high frequency components of input current $I_{IN}$ 114 such that the magnitude of the ac input current $I_{AC}$ 104 at any instant is substantially the average of the dc input current $I_{IN}$ 114, the average taken over a switching period $T_S$. Capacitor C1 110 is small enough to allow the rectified voltage $V_{RECT}$ 112 to become substantially zero twice in every ac line period $T_L$.

Dc-dc converter 116 in the example of FIG. 1 is controlled by a controller 132 to regulate a substantially dc output current $I_O$ 124 that produces an output voltage $V_O$ 126 at a load 128. Output voltage $V_O$ 126 is positive with respect to an output return 130. In one example, load 128 is an arrangement of LEDs.

In the example of FIG. 1, the input return 108 is galvanically isolated from the output return 130. Galvanic isolation prevents dc current from flowing between input and output of the power supply. In other words, a high dc voltage applied between an input terminal and an output terminal of a power supply with galvanic isolation will produce substantially no dc current between the input terminal and the output terminal of the power supply.

Dc-dc converter 116 typically includes at least one switch 118, at least one coupled inductor 120, and at least one capacitor 122. All standard converter configurations with pulsating input currents that are typically used to provide galvanically isolated outputs, such as for example the flyback converter and for example the many variants of the buck converter may be realized by an arrangement of switches, coupled inductors, and capacitors represented by the dc-dc converter block 116 in the example of FIG. 1.

The various components identified with the functions of the dc-dc converter 116 and the controller 132 need not be confined to the boundaries suggested by the boxes drawn in the example power supply 100 of FIG. 1. The individual components are segregated into easily identifiable regions in this disclosure to aid the explanation of the invention. Therefore, for example, a component such as switch 118 may still be considered an element of dc-dc converter 116 when switch 118 is physically located with circuits associated with a different function. For example, switch 118 may be packaged together with bridge rectifier 106, or switch 118 may be included with circuits of controller 132 in an integrated circuit that is manufactured as either a hybrid or a monolithic integrated circuit.

In the example of FIG. 1, controller 132 receives input current sense signal $U_{IN}$ 134 that is representative of the dc input current TIN 114. Controller 132 also receives an output sense signal $U_{OSENSE}$ 136 that may be representative of the output current $I_O$ 124, output voltage $V_O$ 126, or a combination of the two. In other examples, controller 132 may receive a signal that is representative of the rectified voltage $V_{RECT}$ 112 in addition to the output sense signal $U_{OSENSE}$ 136 and the input current sense signal $U_{IN}$ 134.

Embodiments described in this disclosure may use many techniques to sense the input current $I_{IN}$ 114 as the current sense signal $U_{IN}$ 134. For example, the input current may be sensed as a voltage on a discrete resistor, or a current from a current transformer, or a voltage across the on-resistance of a metal oxide semiconductor field effect transistor (MOSFET) when the input current is the same as the current in the transistor, or as a current from the sense output of a current sensing field effect transistor (senseFET). Therefore, this disclosure will omit specific examples of techniques to sense dc input current $I_{IN}$ 114.

In the example of FIG. 1, a switch 118 included in dc-dc converter 116 is responsive to a switching signal (e.g., gate signal 158) received from controller 132. In the example of FIG. 1, gate signal 158 is a logic signal that may be high or low within a switching period $T_S$. In one example, switch 118 is closed when gate signal 158 is high, and switch 118 is open when gate signal 158 is low. A closed switch is sometimes referred to as being in an on state. An open switch is sometimes referred to as being in an off state. In other words, a switch that turns on closes, and a switch that turns off opens.

A switch in an on state may conduct current. A switch in an off state cannot conduct current. Switch 118 in the example of FIG. 1 is sometimes referred to as a single pole single throw (SPST) switch. An SPST switch has two terminals. The pole terminal is coupled to the signal to be switched. An SPST switch couples the pole terminal to the throw terminal when the switch is on. Switches of greater complexity may have multiple pole terminals and multiple throw terminals, with the number of throw terminals generally being equal to or greater than the number of pole terminals. It is appreciated that switches of greater complexity may be realized by multiple SPST switches. In the example of FIG. 1, the dc input current $I_{IN}$ 114 is a pulsating current that is substantially zero when gate signal 158 is low.

It is appreciated that input current sense signal $U_{IN}$ 134 and output sense signal $U_{OSENSE}$ 136 may be any signals that have a known relationship to the dc input current $I_{IN}$ 114 and the output current $I_O$ 124, or the output voltage $V_O$ 126. In other words, voltage may be sensed as a current signal, and current may be sensed as a voltage signal.

Controller 132 includes a response circuit 138 that includes analog and digital circuits that define the desired response of the gate signal 158 to input current sense signal $U_{IN}$ 134 and output sense signal $U_{OSENSE}$ 136. The response circuit 138 may also include an oscillator (not shown) that provides timing signals such as for example a clock signal 140 that coordinates the operation of other circuits in the power supply, and also may provide other timing signals not shown in FIG. 1 (e.g., a maximum duty cycle signal).

Controller 132 also includes a binary counter 146, a digital-to-analog converter (DAC) 150, and a variable oscillator 156. Binary counter 146 produces logic signals $B_0$ through $B_n$ 148 that represent the binary digits (bits) of the number of events counted, where $B_0$ is the least significant bit (LSB) and $B_n$ is the most significant bit (MSB). In the example of FIG. 1, binary counter 146 receives clock signal 140, a count up signal 142, and a count down signal 144 from response circuit 138. In one example, binary counter 146 is an eight bit counter (i.e., n=7). It is understood that every bit $B_X$ has a complement that is the logical inverse of $B_X$ available to circuits within controller 132. For example, binary counter 146 may produce logic signals $B_0$ through $B_n$ as well as their corresponding complementary logic signals $\overline{B_0}$ through $\overline{B_n}$ (not shown). In another example, controller 132 includes one or more inverters coupled to binary counter 146 to provide the complementary logic signals $\overline{B_0}$ through $\overline{B_n}$ in response to logic signals $B_0$ through $B_n$, respectively.

In the example of FIG. 1, binary counter 146 counts the number of low to high transitions of clock signal 140. When the count up signal 142 is asserted in the example of FIG. 1, clock signal 140 increments the count of the counter. When the count down signal 140 is asserted in the example of FIG. 1, clock signal 140 decrements the count of the counter.

In the example of FIG. 1, DAC 150 converts the binary digits 148 from binary counter 146 into the paired analog signals $U_{TON}$ 152 and $U_{TS}$ 154. The paired analog signals $U_{TON}$ 152 and $U_{TS}$ 154 may be voltages or currents. Analog signals $U_{TON}$ 152 and $U_{TS}$ 154 are restricted to have a fixed sum $U_{MAX}$. In algebraic terms, $$U_{TON} + U_{TS} = U_{MAX} \qquad (EQ. 1)$$

Analog signals $U_{TON}$ 152 and $U_{TS}$ 154 are received by a variable oscillator 156. Variable oscillator 156 produces a gate signal 158 that alternates between high and low values within switching period $T_S$ to switch the switch 118 in dc-dc converter 116.

Variable oscillator 156 responds to the magnitude of analog signal $U_{TON}$ 152 to set the duration $T_{ON}$ of the high value of gate signal 158. Variable oscillator 156 responds to the magnitude of analog signal $U_{TS}$ 154 to set the period $T_S$ of gate signal 158. Therefore, a single digital to analog converter (DAC 150) produces paired analog signals ($U_{TON}$ 152 and $U_{TS}$ 154) in a controller for a power supply.

Variable oscillator 156 may process the paired analog signals $U_{TON}$ 152 and $U_{TS}$ 154 independently to produce desired combinations of $T_{ON}$ and $T_S$ that achieve the desired power factor, efficiency, and output performance of the power supply. In one example, $U_{TON}$ 152 and $U_{TS}$ 154 are currents. In one example, a current corresponding to $U_{TON}$ 152 may charge a capacitor to a fixed threshold voltage to determine the duration $T_{ON}$. In one example, a current corresponding to $U_{TS}$ 154 may charge a capacitor in an oscillator to an upper fixed threshold voltage and discharge the capacitor to a lower fixed threshold voltage to determine the switching period $T_S$. Thus, in one example the time $T_{ON}$ would be inversely proportional to the magnitude of $U_{TON}$ 152 whereas the period $T_S$ would be inversely proportional to the magnitude of $U_{TS}$ 154. When the period $T_S$ is inversely proportional to the magnitude of $U_{TS}$, the frequency $f_S$ is directly proportional to the magnitude of $U_{TS}$.

Figure 2:
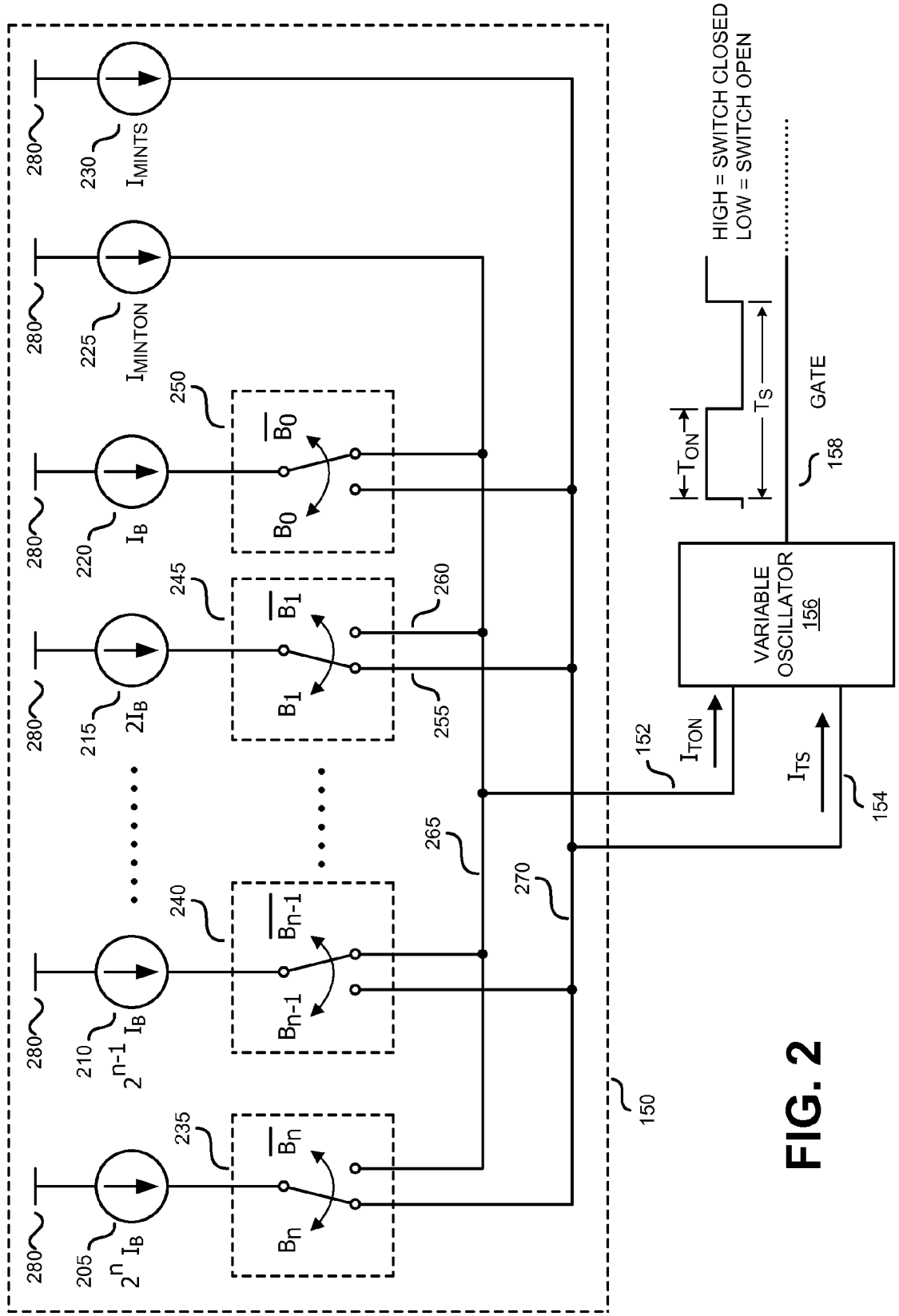
FIG. 2 is functional block diagram of a digital-to-analog converter, in accordance with the teachings of the present disclosure.

FIG. 2 shows an example of how the paired analog signals $U_{TON}$ 152 and $U_{TS}$ 154 may be produced as currents $I_{TON}$ and $I_{TS}$ respectively from a single DAC 150 that receives logic signals 148 that represent the binary digits from a binary counter 146 that produces an output of n+1 bits. Current sources 220, 215, 210 and 205 are coupled to a voltage source 280, and the current sources have magnitudes that are weighted by powers of 2, with the lowest magnitude $I_B$ for current source 220, magnitude twice $I_B$ for current source 215, successively doubling the magnitude for each current source such the current source 205 with highest magnitude has magnitude $2^n I_B$ for a counter with n+1 bits. In one example, the counter is an eight bit counter and thus the highest magnitude of current produced by a single current source may be 128 $I_B$ (i.e., $2^7 I_B$). DAC 150 may optionally include a reference circuit (e.g., see reference circuit 305 of FIG. 3) coupled to each of the current sources 205, 210, 215, and 220 to provide a reference for binary weighting of the currents produced.

Single pole double throw (SPDT) switches 235, 240, 245, and 250 coupled respectively to current sources 205, 210, 215, and 220 are each switched by one of the binary digits 148 from binary counter 146. It is appreciated that an SPDT switch is equivalent to two SPST switches that are coupled at their pole terminals, one switch is on when the other switch is off. In the example of FIG. 2, a high value for one of the digits couples its respective current source to the node 270 such that all the current from the current source contributes to the current $I_{TS}$ of the analog signal 154. Conversely, a low value for one of the digits, (which is a high value for the complement of the digit) couples its respective current source to the node 265 such that all the current from the current source contributes to the current $I_{TON}$ of the analog signal 152.

For example, a high value for binary bit $B_1$ switches SPDT switch 245 to a first position such that the current 2 $I_B$ from current source 215 is switched to node 255, contributing to analog signal 154. Conversely, a low value for binary bit $B_1$ switches SPDT switch 245 to a second position such that the current 2 $I_B$ from current 215 is switched to node 260, contributing to analog signal 152. Thus, for every number from binary counter 146, a current proportional to that number contributes to analog signal 154, while a current proportional to the complement of that binary number contributes to analog signal 152.

In the example of FIG. 2, DAC 150 also includes a current source 225 that sets a minimum current $I_{MINTON}$ for analog signal 152, and a current source 230 that sets a minimum current $I_{MINTS}$ for analog signal 154.

TABLE 1

| $B_3$ | $B_2$ | $B_1$ | $B_0$ | $I_{TON}$ | $I_{TS}$ | $I_{TON}+I_{TS}$ |
|---|---|---|---|---|---|---|
| 0 | 0 | 0 | 0 | $I_{MINTON}+15I_B$ | $I_{MINTS}$ | $I_{MINTON}+I_{MINTS}+15I_B$ |
| 0 | 0 | 0 | 1 | $I_{MINTON}+14I_B$ | $I_{MINTS}+I_B$ | $I_{MINTON}+I_{MINTS}+15I_B$ |
| 0 | 0 | 1 | 0 | $I_{MINTON}+13I_B$ | $I_{MINTS}+2I_B$ | $I_{MINTON}+I_{MINTS}+15I_B$ |
| 0 | 0 | 1 | 1 | $I_{MINTON}+12I_B$ | $I_{MINTS}+3I_B$ | $I_{MINTON}+I_{MINTS}+15I_B$ |
| 0 | 1 | 0 | 0 | $I_{MINTON}+11I_B$ | $I_{MINTS}+4I_B$ | $I_{MINTON}+I_{MINTS}+15I_B$ |
| 0 | 1 | 0 | 1 | $I_{MINTON}+10I_B$ | $I_{MINTS}+5I_B$ | $I_{MINTON}+I_{MINTS}+15I_B$ |
| 0 | 1 | 1 | 0 | $I_{MINTON}+9I_B$ | $I_{MINTS}+6I_B$ | $I_{MINTON}+I_{MINTS}+15I_B$ |
| 0 | 1 | 1 | 1 | $I_{MINTON}+8I_B$ | $I_{MINTS}+7I_B$ | $I_{MINTON}+I_{MINTS}+15I_B$ |
| 1 | 0 | 0 | 0 | $I_{MINTON}+7I_B$ | $I_{MINTS}+8I_B$ | $I_{MINTON}+I_{MINTS}+15I_B$ |
| 1 | 0 | 0 | 1 | $I_{MINTON}+6I_B$ | $I_{MINTS}+9I_B$ | $I_{MINTON}+I_{MINTS}+15I_B$ |
| 1 | 0 | 1 | 0 | $I_{MINTON}+5I_B$ | $I_{MINTS}+10I_B$ | $I_{MINTON}+I_{MINTS}+15I_B$ |
| 1 | 0 | 1 | 1 | $I_{MINTON}+4I_B$ | $I_{MINTS}+11I_B$ | $I_{MINTON}+I_{MINTS}+15I_B$ |
| 1 | 1 | 0 | 0 | $I_{MINTON}+3I_B$ | $I_{MINTS}+12I_B$ | $I_{MINTON}+I_{MINTS}+15I_B$ |
| 1 | 1 | 0 | 1 | $I_{MINTON}+2I_B$ | $I_{MINTS}+13_B$ | $I_{MINTON}+I_{MINTS}+15I_B$ |
| 1 | 1 | 1 | 0 | $I_{MINTON}+1I_B$ | $I_{MINTS}+14I_B$ | $I_{MINTON}+I_{MINTS}+15I_B$ |
| 1 | 1 | 1 | 1 | $I_{MINTON}$ | $I_{MINTS}+15I_B$ | $I_{MINTON}+I_{MINTS}+15I_B$ |

Table 1 illustrates an example relationship between logic signals $B_0$ through $B_3$, $I_{TON}$ and $I_{TS}$. Although Table 1 illustrates the logic signals as including 4 bits, any number of bits may be utilized including 1 or more, in accordance with the teachings of the present disclosure. As shown in Table 1, as the count represented by logic signals $B_0$ through $B_3$ increases, so too does the magnitude of the current contributing to analog signal $I_{TS}$ 154. Table 1 further illustrates that as the count increases, the magnitude of the current contributing to analog signal $I_{TON}$ 152 decreases. However, as stated above, the sum of the analog signals 152 and 154 is a fixed value. Thus, as shown in Table 1, the sum of $I_{TON}+I_{TS}$ remains substantially constant for all values of the binary digits that that are received by DAC 150.

Figure 3:
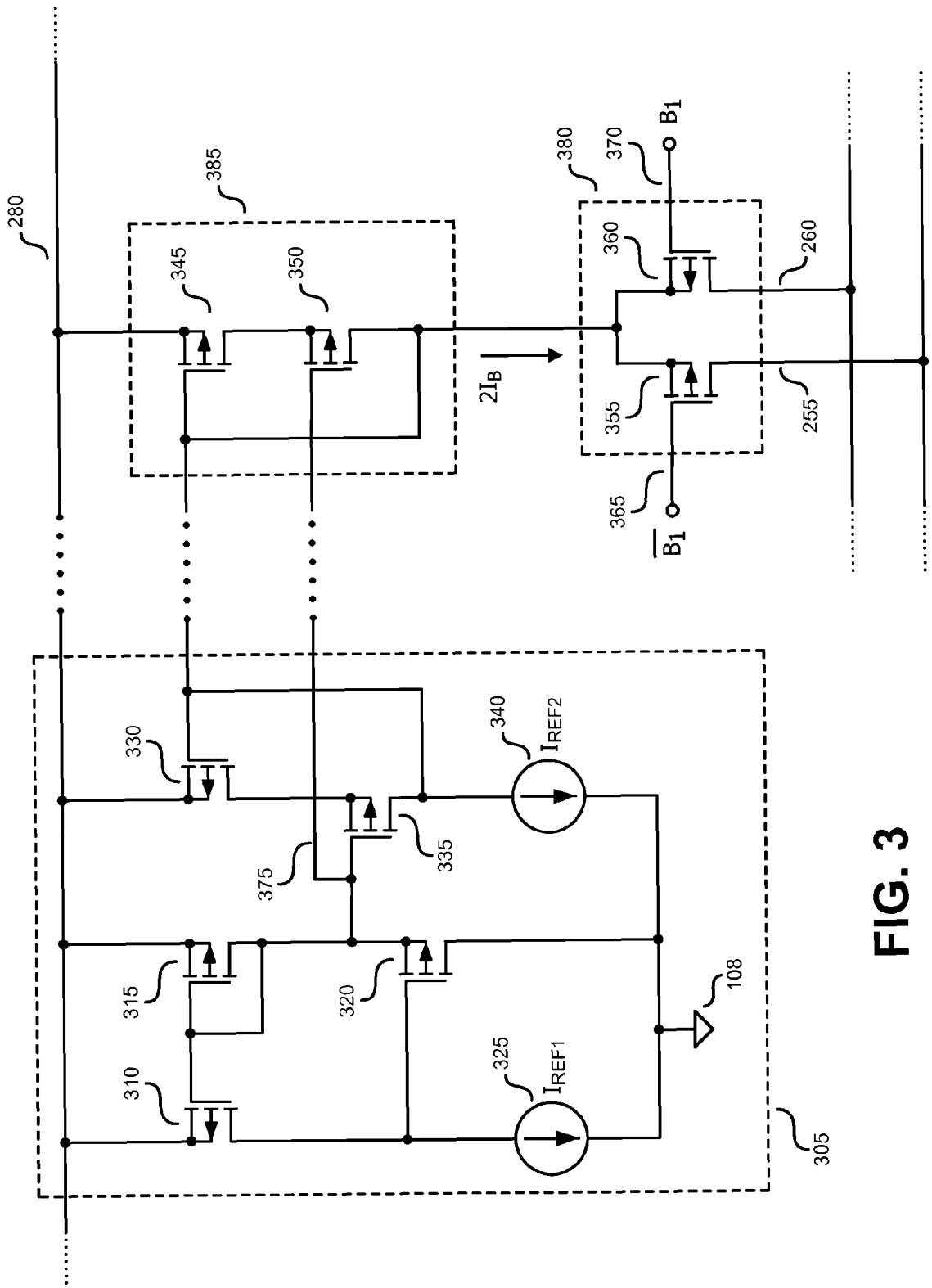
FIG. 3 is an example schematic diagram that shows a reference circuit, a current source, and a switch, in accordance with the teachings of the present disclosure.

FIG. 3 is an example schematic diagram that shows a reference circuit 305, a current source 385, and an SPDT switch 380, in accordance with the teachings of the present disclosure. Current source 375 is one possible implementation of current source 215 of FIG. 2. SPDT switch 380 is one possible implementation of switch 245 of FIG. 2. FIG. 3 further shows a reference circuit 305 that is not shown in FIG. 2, but may be included in DAC 150. In one example reference circuit 305 couples to each binary-weighted current source of FIG. 2. All SPDT switches included in DAC 150 may be identical to SPDT switch 380.

In the example of FIG. 3, reference circuit 305 includes p-channel MOSFETs 310, 315, 320, 330 and 335. Transistors 310 and 315 mirror the current $I_{REF1}$ from a first current source 325 into the source terminal of transistor 320 to establish a reference voltage on node 375. The reference voltage on node 375 is selected to guarantee operation of current source 385 under all anticipated conditions. In one example, $I_{REF1}$ is approximately 1 microampere. A second current source 340 sets the current $I_{REF2}$ in transistors 330 and 335. In one example, $I_{REF2}$ is approximately 2 microamperes. Transistors 330 and 335 are coupled in a typical p-channel cascode arrangement that is duplicated in the arrangement of transistors 345 and 350 to form current source 215 and the other binary-weighted current sources in DAC 150.

The physical dimensions of transistors 345 and 350 may be scaled with respect to transistors 330 and 335 so that the current from current source 385 is the desired multiple of current $I_{REF2}$ from the second current source 340. The scaling of transistors 345 and 350 may include selecting the length and width of channel regions to provide desired ratios of the drain currents. For example, the physical dimensions of transistors 345 and 350 are scaled such that current source 385 provides a current substantially equal to $2 I_B$. Further scaling of the physical dimensions of transistors included in the remaining current sources of DAC 150 may be implemented to achieve the desired binary weighting of each current source as shown in FIG. 2.

Figure 4:
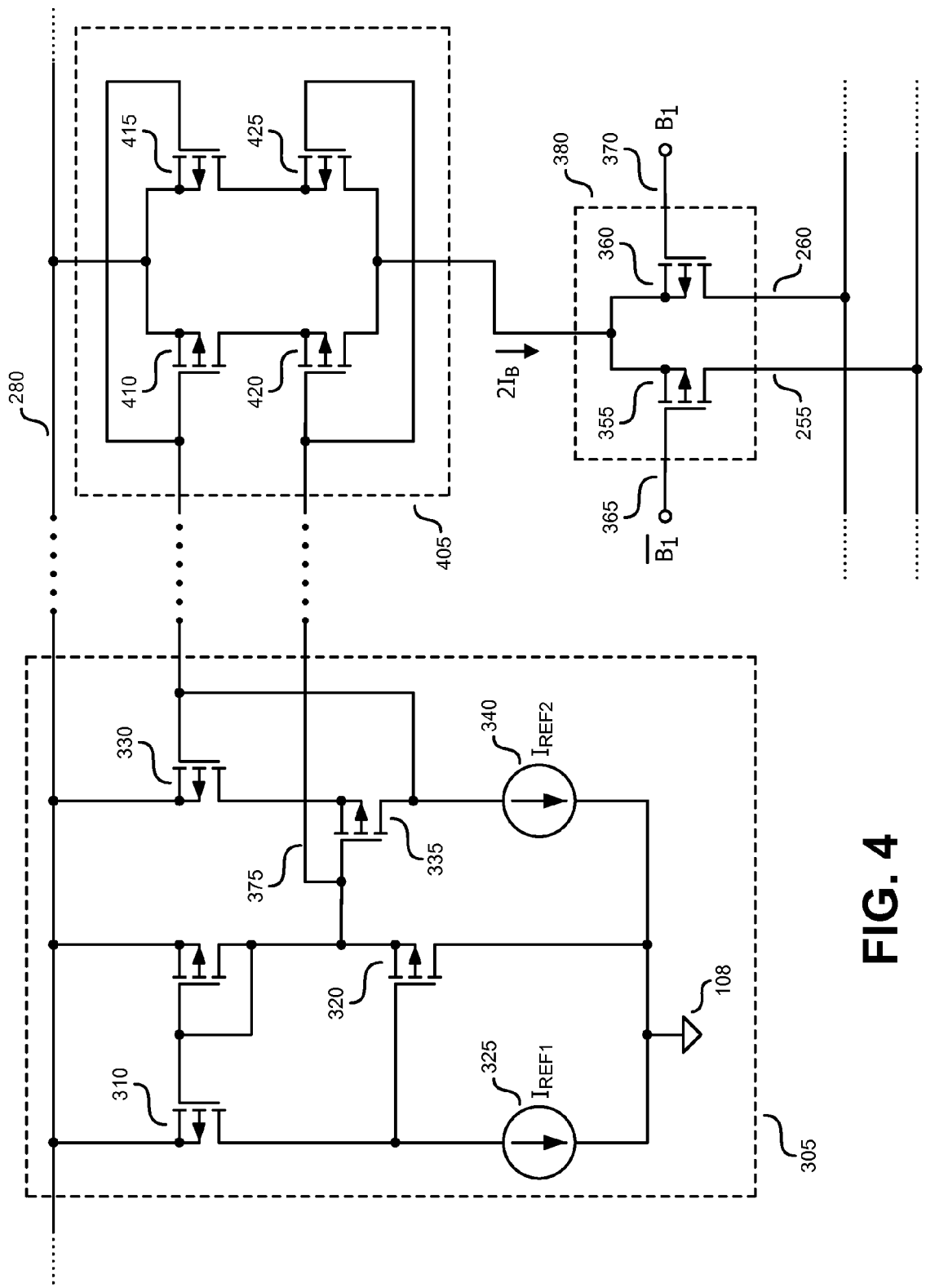
FIG. 4 is another example schematic diagram that shows a reference circuit, a current source, and a switch, in accordance with the teachings of the present disclosure.

The scaling of transistors 345 and 350 may, in the alternative or in addition to, include providing multiple copies of transistors 330 and 335 respectively coupled gate-to-gate, drain-to-drain, and source-to-source to achieve the desired ratios of the drain currents. FIG. 4 is an example schematic diagram that shows reference circuit 305, a current source 405, and SPDT switch 380, in accordance with the teachings of the present disclosure. Current source 405 is one possible implementation of current source 215 of FIG. 2. In the example current source 405 of FIG. 4, the physical dimensions of transistor 330 are substantially the same as the dimensions of transistor 410 and also of transistor 415. Similarly, the physical dimensions of transistor 335 are substantially the same as the dimensions of transistors 420 and 425. However, since the cascode arrangement of transistors 410 and 420 is coupled in parallel to a substantially identical cascode arrangement of transistors 415 and 425 (i.e., the respective gates of transistors 410 and 415 and the respective sources of transistors 410 and 415 are coupled together, while the respective gates of transistors 420 and 425 and the respective drains of transistors 420 and 425 are coupled together), the current provided by current source 405 is scaled to substantially $2 I_B$. Thus, each current source of DAC 150 may include multiple transistors of fixed dimensions coupled in parallel to provide the binary weighting shown in FIG. 2.

Referring now to the examples of both FIGS. 3 and 4, p-channel MOSFETs 355 and 360 form SPDT switch 380. In the SPDT switch 245 of FIG. 2, binary bit $B_1$ from binary counter 146 is coupled to the gate 370 of p-channel transistor 360. In the SPDT switch 245 of FIG. 2, the complement of binary bit $B_1$ from binary counter 146 is coupled to the gate 365 of p-channel transistor 355. When binary bit $B_1$ at the gate 370 of transistor 360 is high to turn transistor 360 off, the complement to binary bit $B_1$ at the gate 365 of transistor 355 is low to turn transistor 355 on. When binary bit $B_1$ at the gate 370 of transistor 360 is low to turn transistor 360 on, the complement to binary bit $B_1$ at the gate 365 of transistor 355 is high to turn transistor 355 off. Thus, when binary bit $B_1$ is high the current from current source 215 is directed to node 255, and when binary bit $B_1$ is low the current from current source 215 is directed to node 260.

The functions of power supply controller 132 are typically realized in an integrated circuit. Therefore, use of a single digital-to-analog converter to provide two control signals in contrast to the use of two digital-to-analog converters to provide the same two control signals reduces the cost of an integrated circuit controller for a power supply.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A digital-to-analog converter (DAC) for a power supply controller, the DAC comprising:
   a first node to be coupled to provide a first analog signal to a variable oscillator of the power supply controller;
   a second node to be coupled to provide a second analog signal to the variable oscillator of the power supply controller;
   a current source; and
   a switch coupled to the current source and configured to couple the current source to the first node to provide current to the first analog signal in response to a binary digit received by the DAC, wherein the switch is further configured to couple the current source to the second node to provide current to the second analog signal in response to a complement of the binary digit,
   wherein the first analog signal is representative of an on-time of a switching signal to be generated by the variable oscillator and the second analog signal is representative of a switching period of a switching signal to be generated by the variable oscillator.

2. The DAC of claim 1, wherein a sum of a magnitude of the first analog signal and a magnitude of the second analog signal is a fixed value.

3. The DAC of claim 1, further comprising:
   a first minimum current source coupled to provide a first minimum current to the first analog signal; and
   a second minimum current source coupled to provide a second minimum current to the second analog signal.

4. The DAC of claim 1, wherein the switch is a single pole double throw switch.

5. The DAC of claim 1, wherein the switch comprises:
   a first transistor coupled between the current source and the first node; and
   a second transistor coupled between the current source and the second node.

6. A digital-to-analog converter (DAC) for a power supply controller,
   the DAC comprising:
   a first node to be coupled to provide a first analog signal to a variable oscillator of the power supply controller;
   a second node to be coupled to provide a second analog signal to the variable oscillator of the power supply controller;
   a plurality of current sources; and a plurality of switches, wherein each switch is coupled to a respective current source and configured to couple its respective current source to the first node to provide current to the first analog signal in response to a respective binary digit received by the DAC, wherein each switch is further configured to couple its respective current source to the second node to provide current to the second analog signal in response to a complement of its respective binary digit,
   wherein the first analog signal is representative of an on-time of a switching signal to be generated by the variable oscillator and the second analog signal is representative of a switching period of a switching signal to be generated by the variable oscillator.

7. The DAC of claim 6, wherein a sum of a magnitude of the first analog signal and a magnitude of the second analog signal is a fixed value.

8. The DAC of claim 6, further comprising:
   a first minimum current source coupled to provide a first minimum current to the first analog signal; and
   a second minimum current source coupled to provide a minimum current to the second analog signal.

9. The DAC of claim 6, wherein the plurality of current sources are binary-weighted current sources.

10. The DAC of claim 9, further comprising a reference circuit coupled to provide a reference voltage to each of the plurality of current sources.

11. The DAC of claim 10, wherein the reference circuit comprises a first transistor and a second transistor coupled together in a cascode arrangement, wherein at least one of the plurality of current sources includes a third and a fourth transistor coupled together in the cascode arrangement, and wherein a dimension of the third and fourth transistors is scaled with respect to a dimension of the first and second transistors to provide a binary weighting of the at least one current source.

12. The DAC of claim 10, wherein the reference circuit comprises a first transistor and a second transistor coupled together in a cascode arrangement, wherein at least one of the plurality of current sources includes a first plurality of transistors having dimensions substantially equal to that of the first transistor, and a second plurality of transistors having dimensions substantially equal to that of the second transistor, wherein the first plurality of transistors are coupled together in parallel and wherein the second plurality of transistors are coupled together in parallel to provide a binary weighting of the at least one current source.

13. The DAC of claim 10, wherein the reference circuit comprises a first transistor and a second transistor coupled together in a cascode arrangement, wherein at least one of the plurality of current sources includes at least two transistors coupled together in a cascode arrangement, each of the at least two transistors having dimensions substantially equal to that of the first and second transistor respectively, wherein each of the at least two transistors conducts a current to provide a binary weighting of the at least one current source.

14. A digital-to-analog converter (DAC) for a power supply controller, the DAC comprising:
    a first node to be coupled to provide a first analog signal to a variable oscillator of the power supply controller, wherein the oscillator is to generate a switching signal having an on time that is responsive to the first analog signal;
    a second node to be coupled to provide a second analog signal to the variable oscillator of the power supply controller, wherein the oscillator is to generate the switching signal having a switching period that is responsive to the second analog signal; and
    means for generating the first and second analog signals in response to a plurality of binary digits.

15. The DAC of claim 14, wherein a sum of a magnitude of the first analog signal and a magnitude of the second analog signal is a fixed value.

* * * * *